DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JANUARY 7, 1975

930 O.G. 115

T930,003

METHOD FOR COMPACTING VECTOR GENERATION DATA

Paul F. Nee, Gaithersburg, Md., assignor to International Business Machines Corporation, Armonk, N.Y.

Continuation of abandoned application Ser. No. 267,868, June 30, 1972. This application Jan. 24, 1974, Ser. No. 436,257

**Int. Cl. G06f *7/00***

U.S. Cl. 444—1

7 Sheets Drawing. 11 Pages Specification

FIG. 4a

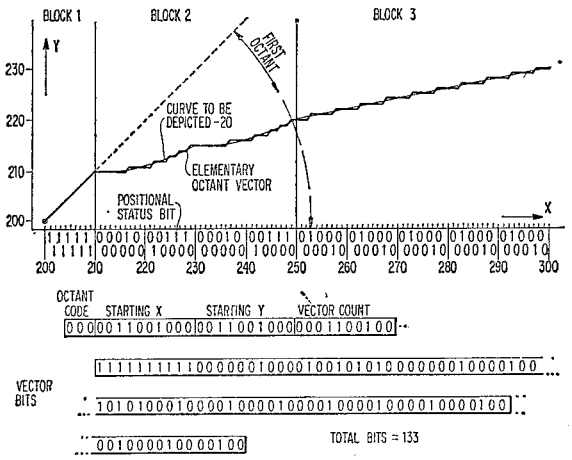

Figure 4A:
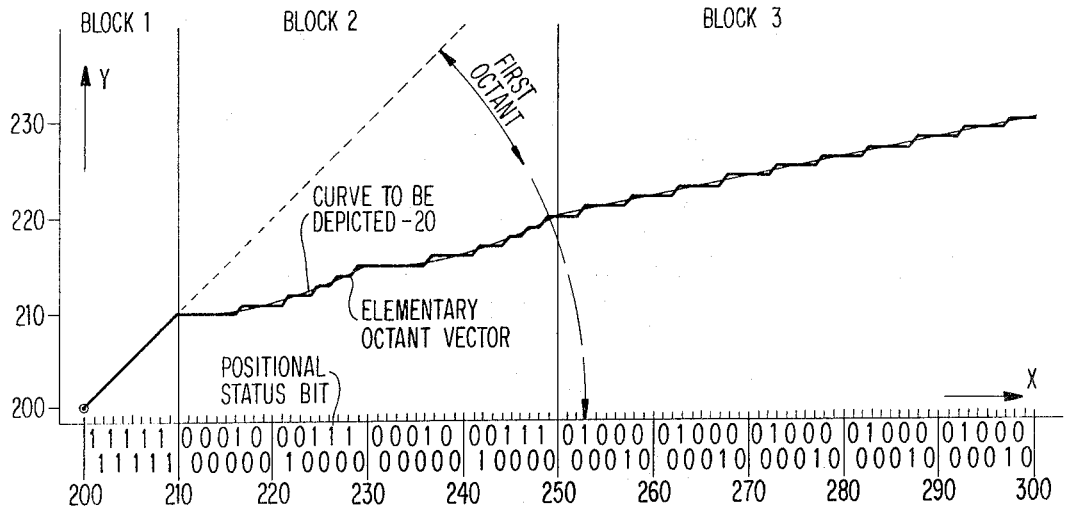
Figure 4B:
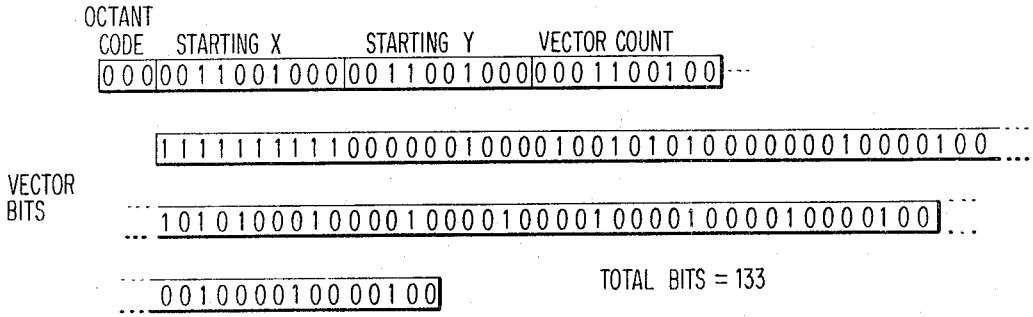
Figure 4C:
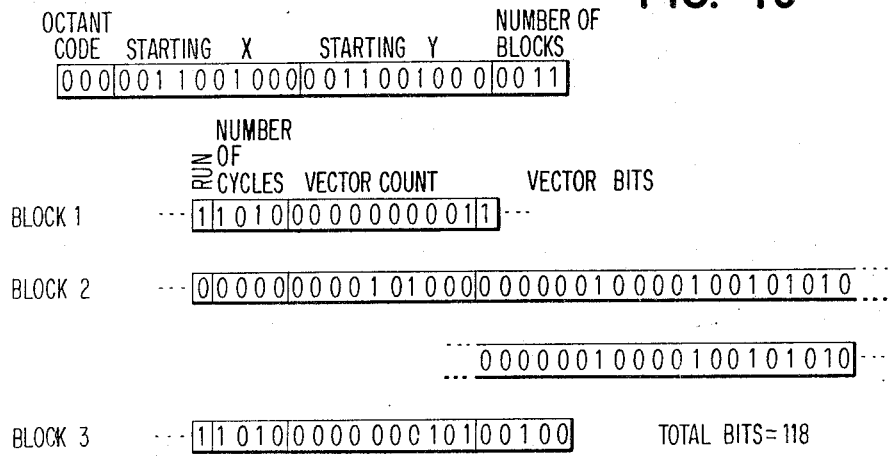
Figure 6:
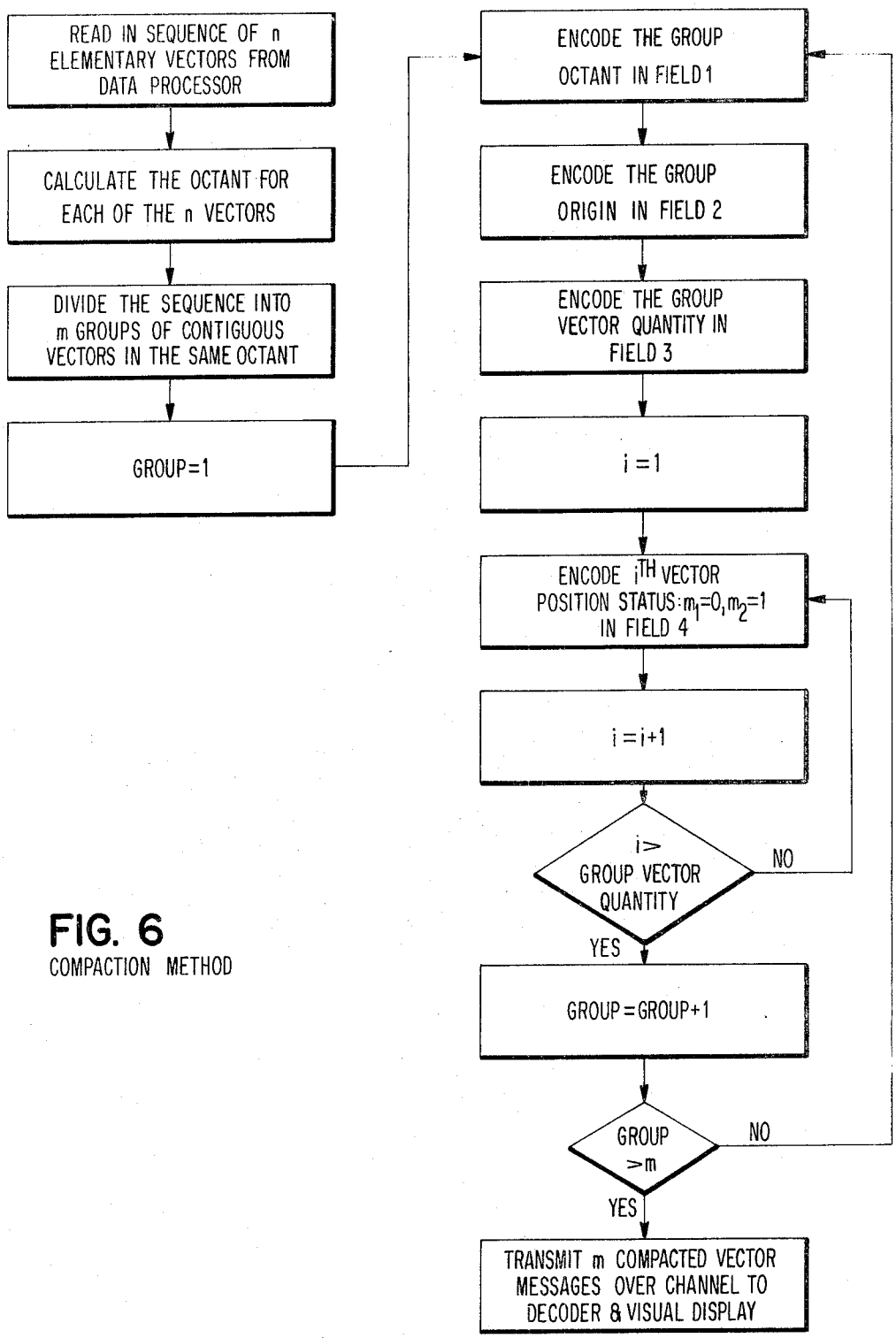
Figure 7:
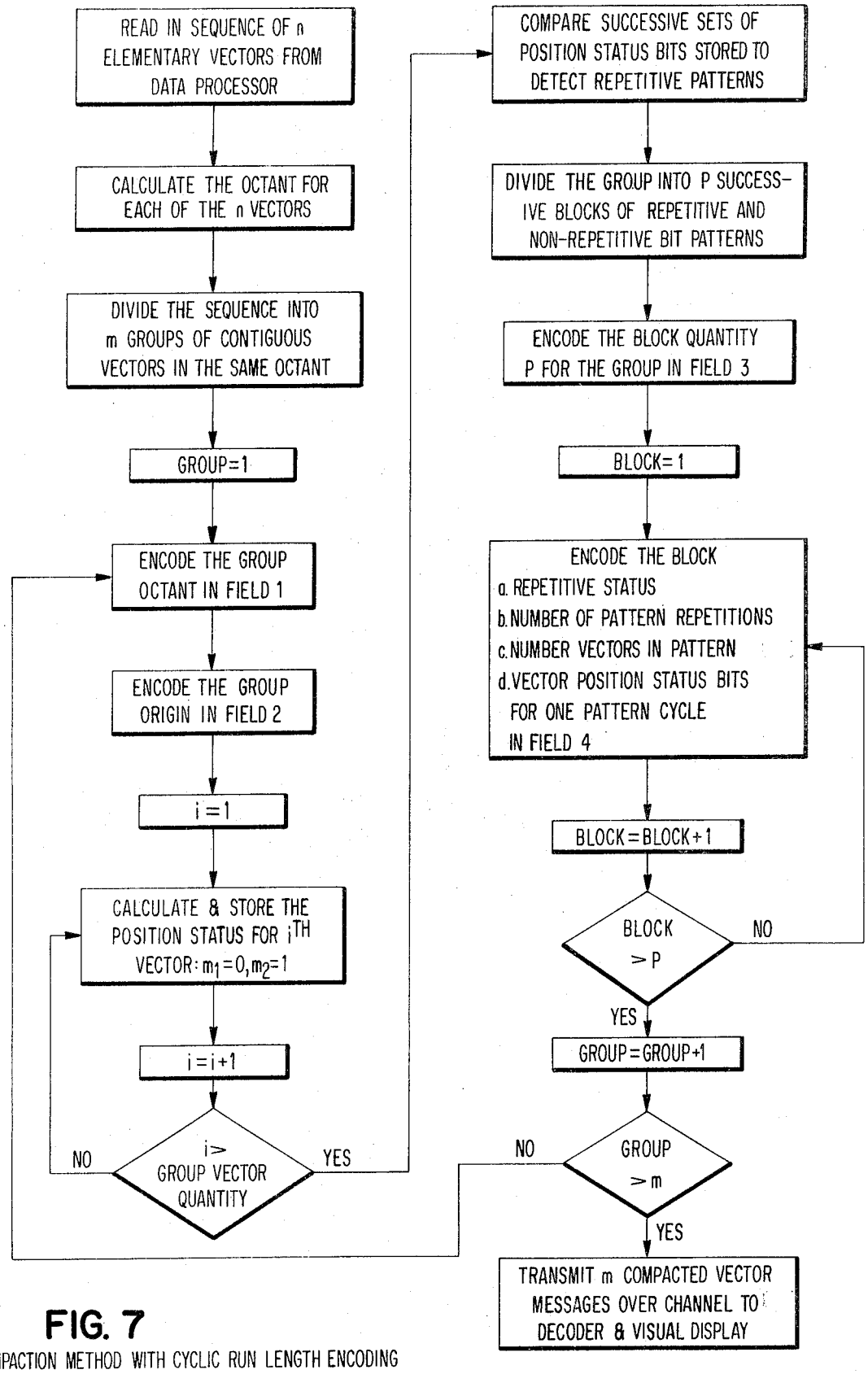
Figure 8:
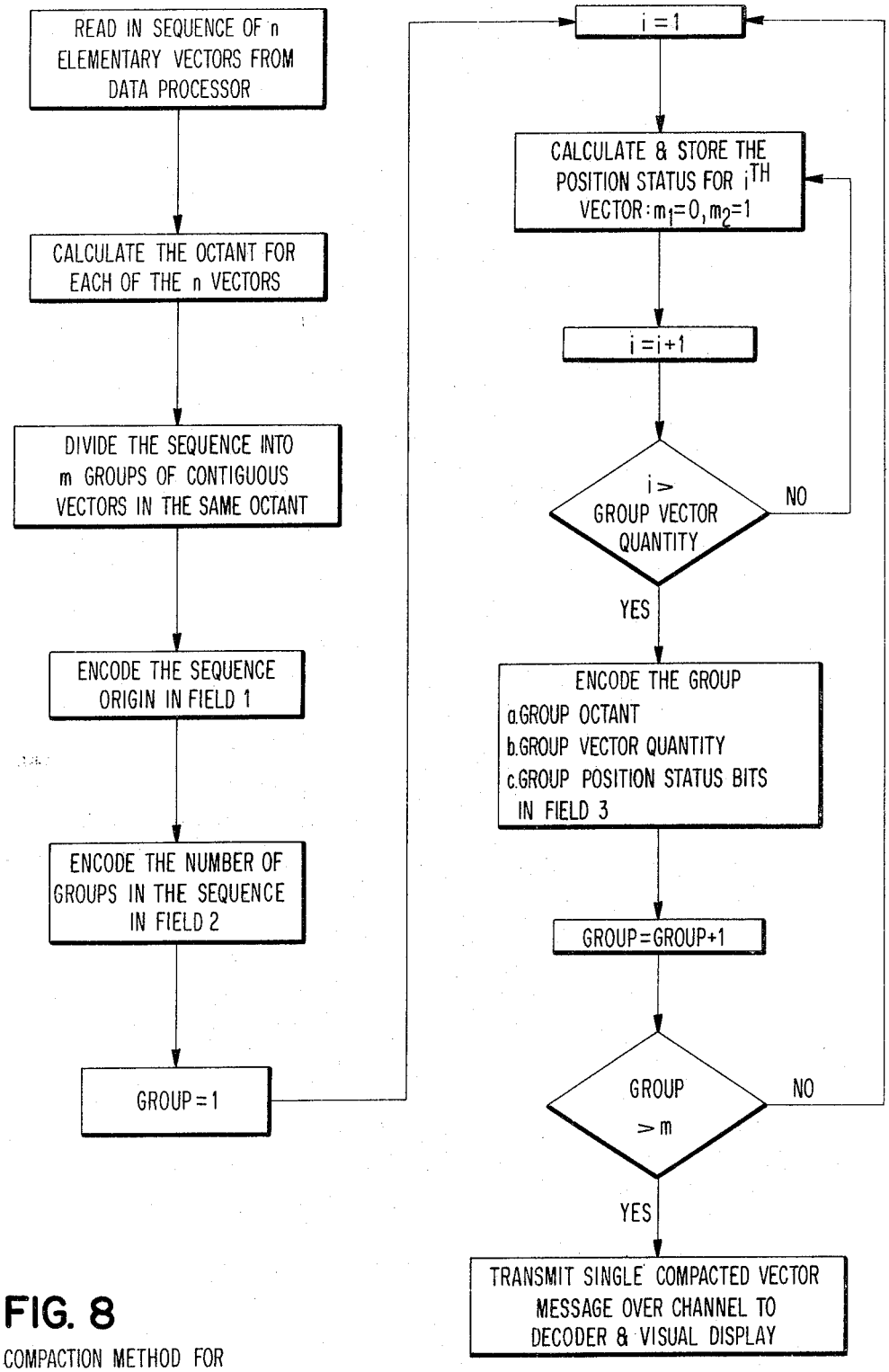

A method is disclosed for compacting vector generation data for transmission from a data processor to a visual display device. The data to be compacted is a sequence of cartesian coordinates representing elementary octant vectors composing the figure to be displayed. The method is based on the concept of dividing the sequence of elementary vectors, Figure 4a, into groups of contiguous elementary vectors which lie within the same octant. An elementary octant vector lying within a given octant must either lie along the cartesian grid line or along the diagonal to the grid line. Thus, if the octant is identified and the coordinates of the origin of the first vector given, each elementary octant vector therein can be identified by a single binary digit. The data compaction method converts the sequence of cartesian coordinates into a serially compacted vector message, Figure 4b, having origin coordinate, octant identity, vector count, and vector status bit components.

METHOD FOR COMPACTING VECTOR GENERATION DATA
Original Filed June 30, 1972 7 Sheets-Sheet 1
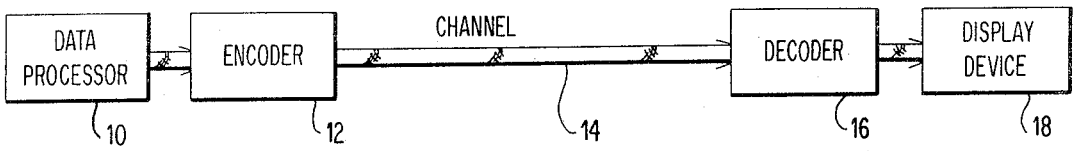
FIG. 1
FIG. 2a
PRIOR ART
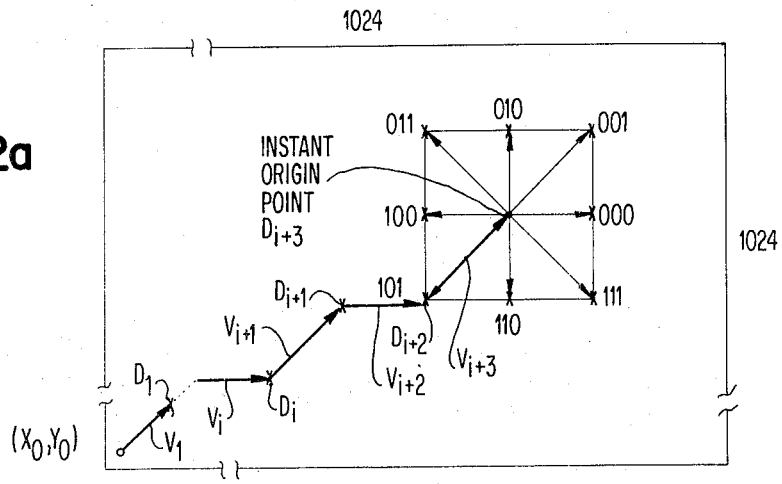
| STARTING $X_0$ | STARTING $Y_0$ | VECTOR COUNT | $V_1$ | $V_2$ | $V_3$ | | $V_{n-1}$ | $V_n$ |
|---|---|---|---|---|---|---|---|---|
| 0011001000 | 0011001000 | 0001100100 | 001 | 001 | 001 | | 000 | 000 |
300
n=100
FIG. 2b
PRIOR ART
TOTAL BITS=330

METHOD FOR COMPACTING VECTOR GENERATION DATA
Original Filed June 30, 1972 7 Sheets-Sheet 2
FIG. 3a
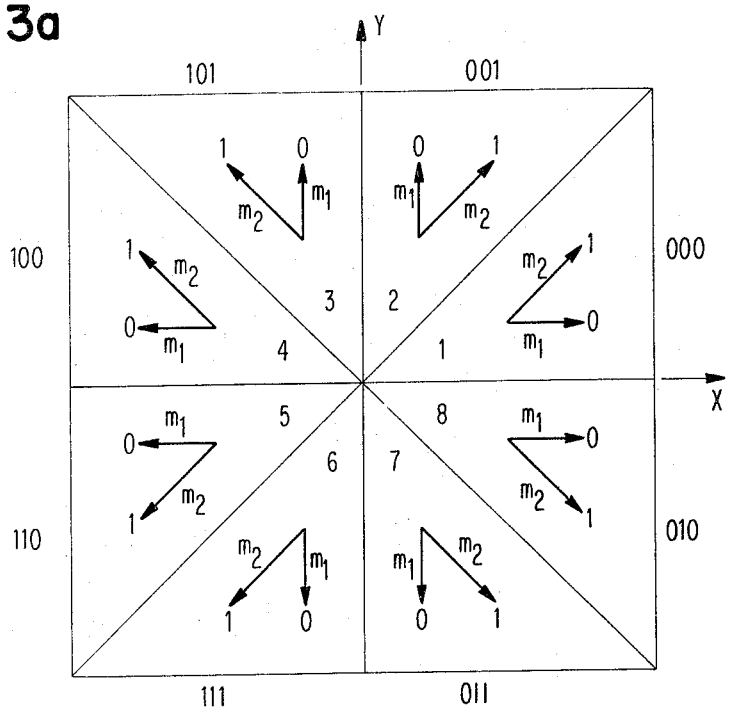
FIG. 3b
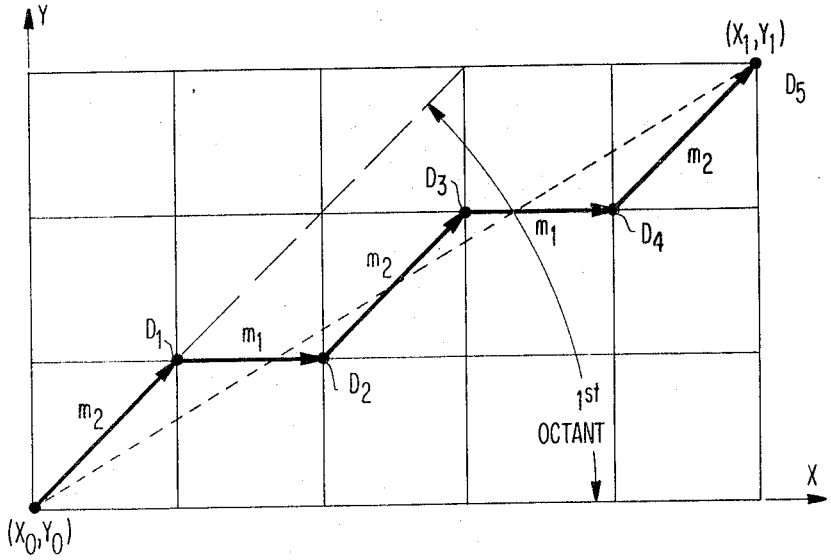
FIG. 3c
| OCTANT CODE FIELD (FIRST) | ORIGIN FIELD ($X_0$) | COORDINATE ($Y_0$) | VECTOR COUNT FIELD (5) | VECTOR POSITION STATUS BIT FIELD ($m_2$) | ($m_1$) | ($m_2$) | ($m_1$) | ($m_2$) |
|---|---|---|---|---|---|---|---|---|
| 0 0 0 | | | 1 0 1 | 1 | 0 | 1 | 0 | 1 |

METHOD FOR COMPACTING VECTOR GENERATION DATA

Original Filed June 30, 1972 7 Sheets-Sheet 3

METHOD FOR COMPACTING VECTOR GENERATION DATA
Original Filed June 30, 1972 7 Sheets-Sheet 4
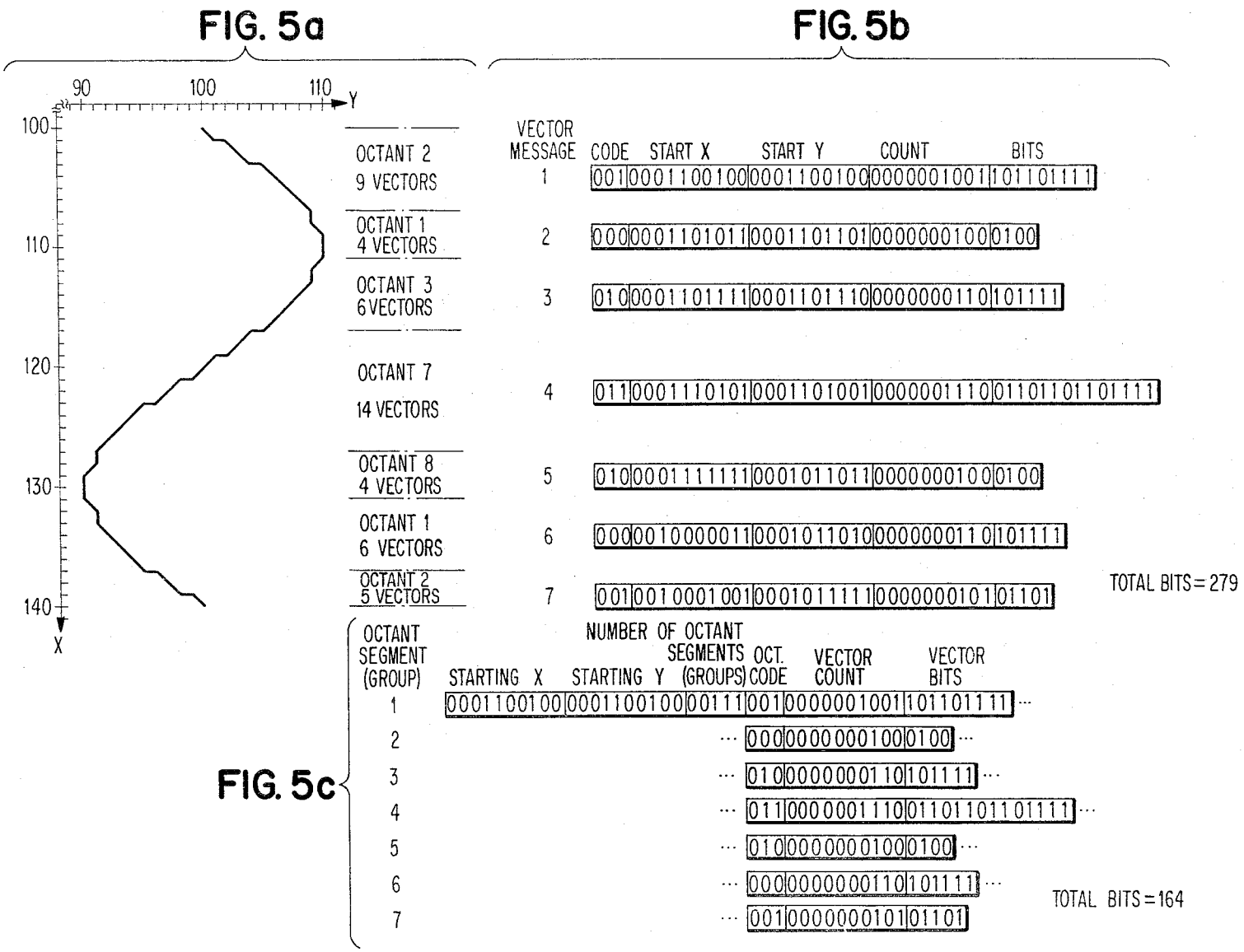

METHOD FOR COMPACTING VECTOR GENERATION DATA

Original Filed June 30, 1972 7 Sheets-Sheet 5

COMPACTION METHOD

METHOD FOR COMPACTING VECTOR GENERATION DATA

Original Filed June 30, 1972 7 Sheets-Sheet 6

COMPACTION METHOD WITH CYCLIC RUN LENGTH ENCODING

COMPACTION METHOD FOR MULTI-OCTANT MESSAGE